United States Patent [19]

Nakajima et al.

[11] Patent Number: 4,823,863

[45] Date of Patent: Apr. 25, 1989

[54] THERMAL CONDUCTION DEVICE

[75] Inventors: Tadakatsu Nakajima, Ibaraki; Wataru Nakayama, Kashiwa; Shigeo Oohashi, Ibaraki; Heikichi Kuwabara, Ibaraki; Takahiro Daikoku, Usiku, all of Japan

[73] Assignee: Hitachi, Ltd., Tokyo, Japan

[21] Appl. No.: 28,202

[22] Filed: Mar. 20, 1987

[30] Foreign Application Priority Data

Mar. 20, 1986 [JP] Japan .................................. 61-60558

[51] Int. Cl.⁴ .............................................. F28F 7/00
[52] U.S. Cl. .................................. 165/80.4; 165/907; 361/385; 357/82
[58] Field of Search .................. 165/80.4, 907, 185; 361/385; 357/82

[56] References Cited

U.S. PATENT DOCUMENTS

| | | | |
|---|---|---|---|
| 3,993,123 | 11/1976 | Chu et al. | 165/80 |
| 4,209,799 | 6/1980 | Schierz et al. | 165/80.4 X |
| 4,233,645 | 11/1980 | Balderes et al. | 361/385 |
| 4,266,281 | 10/1980 | Chu | 165/80.4 X |
| 4,341,432 | 7/1982 | Cutchaw | 165/80.4 X |
| 4,381,818 | 5/1983 | Sachar et al. | 165/907 X |
| 4,649,990 | 3/1987 | Kurihara et al. | 165/80.4 |

OTHER PUBLICATIONS

Microcapillary Thermal Interface Technology for VLSI Packaging, Tuckerman et al., 9/83, pp. 60-61.

Primary Examiner—Ira S. Lazarus
Assistant Examiner—Richard R. Cole
Attorney, Agent, or Firm—Antonelli, Terry & Wands

[57] ABSTRACT

The present invention relates to a thermal conduction device well suited to cool electronic components such as semiconductor devices, in which a porous layer is provided at the surface part of the contact interface of a heat generating element or a heat sink element, and a liquid such as oil is contained in cavities formed in the porous layer, the heat generating element and the heat sink element being held in close contact by the surface tension of the liquid, whereby heat generated by the heat generating element is transferred to the heat sink element.

6 Claims, 2 Drawing Sheets

THERMAL CONDUCTION DEVICE

BACKGROUND OF THE INVENTION

The present invention relates to a thermal conduction device in which a heat sink element is held in contact with the surface of a heat generating element so as to transfer heat in a direction from the heat generating element to the heat sink element, and more particularly to the device which lessens a temperature difference at the contact interface attendant upon the transfer of heat. The present invention is well suited to cool electronic components such as semiconductor devices.

A method of eliminating heat from a heat generating element has been known from, for example, U.S. Pat. No. 3,993,123. According to the method, a large number of integrated circuit chips are packaged on a substrate through metal connections for attaining electrical connections, and a heat sink element is mounted on the upper surface of each integrated circuit chip. Heat generated in the chip is transmitted to a cap via the heat sink element, and is carried away out of the system by a coolant flowing through a passage within the cap. Here, when the chip and the heat sink element are fastened by a solder or the like, shear stresses act on the chip and the metal connections at the time of the heat generation of the chip on account of the differences between the coefficients of thermal expansion of the chip and substrate and between those of the heat sink element and cap, and the chip and the metal connections might be damaged. Besides, operations for the maintenance of the chips are not easy. In general, therefore, the method is adopted in which the chip and the heat sink element are held in a mere contact state without being secured. Meanwhile, in this case, to the end of lessening a temperature difference at the contact interface, a gas of high heat conductivity such as helium gas or a liquid such as grease or silicone oil is often packed between the contact surfaces. However, even when the gas or liquid is packed between the chip and the heat sink element, the extent to which the temperature difference can be lessened is limited. More specifically, the chip and the heat sink element do not come into a perfect surface contact because of the warp of the chip, and a considerably great gap is partly formed at the contact portion thereof. It is known that, in general, the gap is on the order of 20 $\mu$m. Since the above temperature difference is proportional to the size of the gap between the surfaces confronting each other, the gap forms an obstacle in the case of intending to lessen the temperature difference.

In addition, a contact interface structure which can correct the warp of a chip so as to bring the chip into close contact with a heat sink element has been proposed as disclosed in "1983 Symposium on VLSI technology, Maui, Digest of technical papers, Session 5-6, pp. 60-61 (Sept. 1983)." According to the proposal, a large number of reentrant cavities each having minute structural dimensions of $\mu$m order are provided in the surface portion of the heat sink element to come into contact with the chip, and silicone oil is injected into each of the reentrant cavities so as to form a meniscus at an upper position of the cavity. Using the contact interface structure thus constructed, the chip is adsorbed to the heat sink element by the surface tension of the liquid, and the chip can be held in close contact with the heat sink element under the state under which the warp of the chip is cured. Moreover, since the cavities are in the reentrant form, the menisci within the respective cavities are kept stable.

The prior art based on the reentrant cavities has the following disadvantages:

(1) The fabrication of the cavities is difficult, and the structure is not suited to mass production.

(2) The materials of the contact surface in which such cavities can be machined are limited. It is impossible to freely select a material which is advantageous from the standpoint of, for example, the conduction of heat.

(3) Since the root part of a ridge held between the adjacent cavities is very slender, the structure is mechanically fragile and is unsuited to practical use.

(4) A communicating groove for bringing the reentrant cavities into communication so as to equalize the heights of the menisci in the respective reentrant cavities is provided in only one place at a lower position of the reentrant cavities. Therefore, once a void has been formed within the communicating groove, it is held intact, and the communicating groove fails to function. As a result, the liquid cannot move so as to equalize the heights of the menisci in the respective reentrant cavities, and the effect of the reentrant form is lost.

(5) Since each reentrant cavity is in the two-dimensional form, a great force of adsorption cannot be attained.

SUMMARY OF THE INVENTION

An object of the present invention is to provide a thermal conduction device which cures the warp of a heat generating element to attain the close contact between the heat generating element and a heat sink element, so that heat generated by the heat generating element can be transferred to the heat sink element with a small temperature difference.

Another object of the present invention is to provide a thermal conduction device which is easy of fabrication and exhibits a high strength, and in which a heat generating element can be held on a heat sink element with a great force of adsorption, while the heat generation element and the heat sink element can be readily separated.

Still another object of the present invention is to provide a thermal conduction device which can remarkably lower a thermal resistance from a heat generating element to a heat sink element.

In order to accomplish the objects, the present invention constructs a thermal conduction device by comprising on a surface of a heat generating element or a heat sink element, a porous layer which has been formed by sintering ultrafine grains and which has microscopic cavities, and a liquid which is contained in said cavities, the heat generating element and the heat transmission element being held in close contact by a surface tension of said liquid.

Another feature of the present invention consists in a thermal conduction device comprising on a surface of a heat generating element or a heat sink element, a porous of 0.1-10 $\mu$m, and a liquid which is contained in cavities formed in said porous layer, the heat generating element and the heat sink element being held in close contact by a surface tension of said liquid.

Other objects, features and advantages of the present invention will become apparent from the ensuing description taken with reference to the accompanying drawings.

DESCRIPTION OF THE PREFERRED EMBODIMENTS

Figure 2:
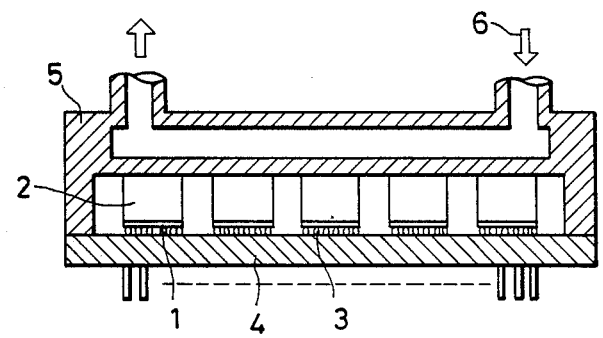
FIG. 2 is a vertical sectional view showing the whole setup of a thermal conduction device.

FIG. 2 is a view showing the whole setup of a cooling device, namely, thermal conduction device for integrated circuit chips. The integrated circuit chips 1 in a large number are packaged on a substrate 4 through metal connections 3 for electrical connections. A heat sink element 2 is mounted on the upper surface of each IC chip 1. Heat generated in the chip 1 is transferred to a cap 5 via the heat sink element 2, and is carried out of the device by a coolant 6 flowing through a passage formed in the cap 5.

Figure 1:
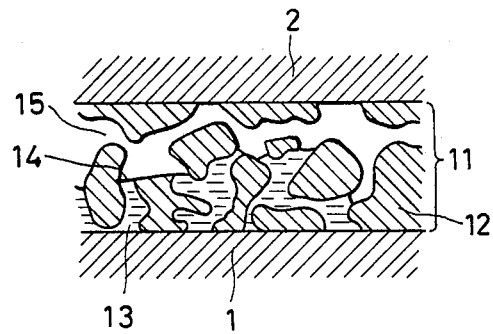
FIG. 1 is a sectional view of essential portions showing an embodiment of the present invention.

Next, one embodiment of the present invention for the contact portion between the chip 1 and the heat sink element 2 will be described with reference to FIG. 1.

A sintered layer (porous layer) 11 of grains having diameters of approximately 0.1-10 $\mu$m, desirably 1-5 $\mu$m is provided on the surface of the heat sink element 2, and the heat generating element 1 is held in close contact with the surface of the porous layer 11 remote from the heat sink element 2. A cavity formed in the porous layer 11 is filled with a liquid 13 of low vapor pressure, for example, silicone oil while leaving a space 15 vacant. A meniscus 14 is formed in an interstice among the grains 12.

The liquid 13 sealed in the porous layer 11 fills the interstice among the sintered grains 12 owing to a capillary force, and forms the meniscus 14. In this case, the menisci 14 formed in the individual gaps of the grains are all held at equal radii of curvature, for the reasons that all the gaps communicate in three dimensions and that the sintered layer 11 is very thin and is hardly affected by gravity. Accordingly, the difference between the pressures of the space portion 15 and the liquid portion 13 is constant everywhere. In addition, since reentrant cavities in a random distribution are formed in the interstice within the porous layer 11, the menisci 14 are always held convex toward the liquid, and the pressure of the liquid portion becomes lower than that of the space portion. Owing to this pressure difference, the heat generating element 1 is adsorbed to the sintered layer 11 into a close contact state. The force of adsorption F in this case is expressed by:

$$F = S \cdot 2\delta / r \text{ (dyne)}$$

where r denotes the radius of curvature of the meniscus 14, $\delta$ the surface tension of the liquid, and S the contact area between the heat generating element 1 and the porous layer 11. By way of example, in case of $S=4$ cm$^2$, $r=5\times10^{-5}$ cm and $\delta=37$ dynes/cm (silicone oil), an adsorptive force of $F=5.9\times10^6$ dynes is obtained. Owing to this adsorptive force, a silicon wafer having an area of 2 cm$\times$2 cm and a thickness of 0.05 cm can be flexed 0.004 cm, and the warp (about 0.002 cm) of the silicon wafer can be perfectly cured. The curing effect is expressed as follows, in terms of the thermal resistance between the heat release generating and the heat sink element: In a case where the warp is not corrected under the above conditions, the thermal resistance is 0.33° C./W. In a case where the warp is corrected with the present embodiment, the thermal resistance becomes 0.0013° C./W (sintered grains: copper grains, thickness of the sintered layer: 0.002 cm, and void ratio: 0.5), and it can be reduced to about 1/250.

The porous layer 11 in the present embodiment can be readily produced in the following way: Ultrafine grains having grain diameters of approximately 0.1-10 $\mu$m are sintered and formed on the surface of the heat sink element 2, and the surface of the sintered layer is finished up to be smooth by cutting, polishing, press work, etc. On this occasion, burrs are stretched out on the finished surface, and pores are closed up. However, the pores are recovered by removing the burrs with etching or the like. Subsequently, the liquid in a small amount not filling the entire cavity is put on the porous layer 11, and the heat sink element 2 provided with the sintered layer 11 is pushed against the heat generating element 1 so as to adsorb this heat generating element 1.

Figure 3:
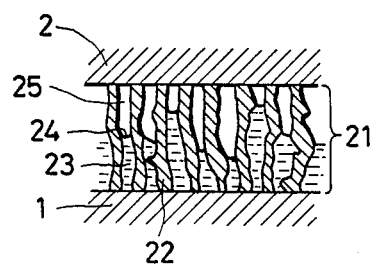
FIGS. 3-6 are sectional views of essential portions, each showing another embodiment of the present invention.

FIG. 3 shows another embodiment of the present invention. The surface of the heat sink element 2 is provided with a needle-like porous layer 21, which is held in contact with the heat generating element 1. As in the embodiment of FIG. 1, the needle-like porous layer 21 is filled with, for example, silicone oil while leaving a vacant space 25 in an upper part thereof, and a meniscus 24 is formed between the space 25 and the liquid portion 23. The needle-like porous layer in the present embodiment can be readily prepared as follows: A molten layer of aluminum solder is deposited on the surface of the heat sink element 2, and it is quenched. The surface of needle protrusions thus grown is polished. At the stage of the polishing, burrs appear on the surface of the needle protrusions, and the cavities of the porous layer 21 are closed up. Some of the burrs are removed by chemical etching. Thus, the porous layer 21 formed from needle crystals 22 having diameters of approximately 0.1-10 $\mu$m as shown in FIG. 3 is obtained. Such a porous layer based on needle crystals can also be made by electroplating with ease.

Figure 4:
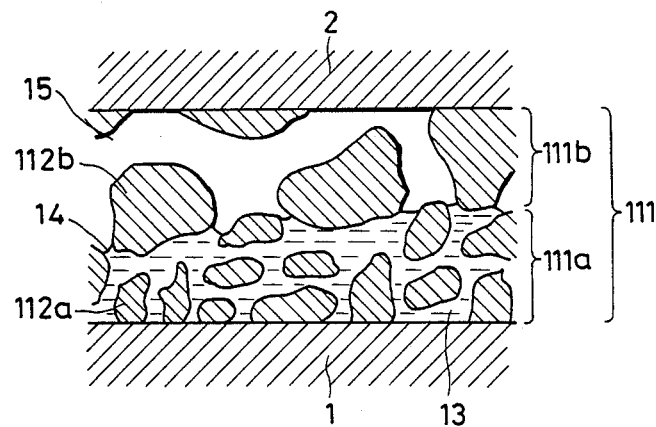
Figure 5:
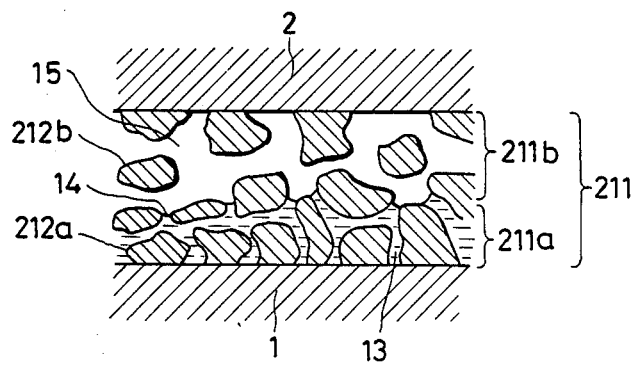
Figure 6:
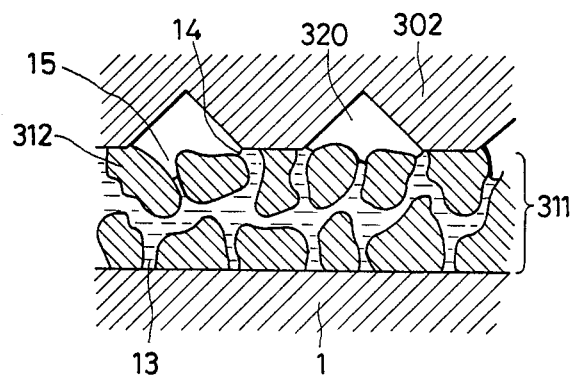

FIGS. 4-6 show other embodiments of the present invention, respectively. Any of these embodiments can hold the positions of the menisci more stably than the embodiment shown in FIG. 1, and is excellent as a thermal conduction device holding the heat generating element 1 and the heat sink element 2 in close contact.

The embodiment shown in FIG. 4 is such that grains 112a and 112b of different sizes are sintered in the form of layers. A porous layer 111 is made under the condition that the grain diameters of the sintered layer 111a on the side of the heat generating element 1 are smaller, while those of the sintered layer 111b on the side of the heat sink element 2 are larger. When the sintered layers 111a and 111b are arranged as in this embodiment, the diameters of individual cavities can be rendered smaller in the sintered layer 111a and larger in the sintered layer 111b. Therefore, the position of the meniscus 14 can be always held in the finer sintered layer 111a, and the space 15 not filled with the liquid can be ensured stably. It is consequently possible to perfectly prevent the situation in which only a certain part of the porous layer is completely filled up with the liquid, whereas only gases exist in another part. It is accordingly possible to attain a force of adsorption which is uniform everywhere on the surface of the heat generating element 1.

The embodiment of FIG. 5 is such that, after grains of equal grain diameters have been sintered, only the part of the sintered layer nearer to the heat generating element 1 is crushed by a roller or the like. Thus, a porous layer 211 having a dense sintered layer 211a and a coarse sintered layer 211b is formed. This embodiment achieves the same function and effect as those of the embodiment shown in FIG. 4.

The embodiment of FIG. 6 is such that the surface of a heat sink element 302 is formed with V-shaped notches 320, on which a sintered layer 311 is formed. The portion of the notches 320 plays the role of the sintered layer 111b or 211b of larger cavity diameters in the embodiment shown in FIG. 4 or FIG. 5. Although, in the present embodiment, the V-shape has been illustrated as the shape of the notch 320, another sectional shape such as rectangle or circular arc realizes a similar function.

Each of the foregoing embodiments has the effect that, owing to the force of adsorption based on the surface tension of a liquid, the warp of a heat generation element can be corrected to bring a heat sink element and the heat generating element into mutual close contact under the state under which only gaps ascribable to the roughness of the surfaces of the respective elements are left behind. Moreover, since the gaps (cavities) can be filled up with the liquid of high heat conductivity, the thermal resistance of the interface between the heat generating element and the heat sink element in the case of transferring heat from the former to the latter can be remarkably lowered. Furthermore, since the heat generating element and the heat sink element are held in close contact by the liquid, they can be readily separated, to produce the effect that the maintenance operations of the heat generating element and the heat sink element are facilitated.

As described above, according to the present invention, the warp of a heat generating element can be corrected to enhance the close contact between the heat generating element and a heat sink element. Accordingly, there is the effect that heat generated in the heat generating element can be transferred to the heat sink element with a small temperature difference.

What is claimed is:

1. A thermal conduction device comprising a heat generating element, a heat sink element which carries heat generated by said heat generating element, out of said device, notches which are formed in a surface of said heat sink element, a porous layer which is formed by sintering ultrafine grains and has microscopic cavities and which is provided on said notches of said surface of said heat sink element, and a liquid which is contained in said cavities, said heat generating element being held in close contact with said porous layer by a surface tension of said liquid.

2. A thermal conduction device according to claim 1, wherein said heat generating element is an integrated circuit chip which is packaged on a substrate through metal connections for establishing electrical connections.

3. A thermal conduction device according to claim 1, wherein said notches formed in said surface of said heat sink element are V-shaped, and said porous layer is filled with silicone oil so as to leave a vacant space in the notch portion.

4. A thermal conduction device comprising:
   a heat generating element;
   a heat sink element which carries heat generated by said heat generating element, out of said device, and which has notches formed in a surface arranged opposite to the heat generating element;
   a porous layer which is formed by sintering ultra fine grain and has microscopic cavities and which is provided between said heat generating element and said heat sink element; and
   a liquid within said cavities;
   wherein the porous layer is less than dense in a vicinity of the heat sink element than in a vicinity of the heat generating element; and said heat generating element is held in close contact with the porous layer by surface tension of said liquid.

5. A thermal conduction device according to claim 4, wherein said heat generating element is an integrated circuit chip which is packaged on a substrate through metal connections for establishing electrical connections.

6. A thermal conduction device according to claim 4, wherein said notches formed in said surface of said heat sink element are V-shaped, and said porous layer is filled with silicon oil so as to leave a vacant space in the notch portion.

* * * * *